United States Patent
Jeong et al.

(10) Patent No.: US 7,495,590 B2
(45) Date of Patent: Feb. 24, 2009

(54) METHOD OF COMPENSATING CHANNEL OFFSET VOLTAGE FOR COLUMN DRIVER AND COLUMN DRIVER FOR LCD IMPLEMENTED THEREOF

(75) Inventors: Deog-Kyoon Jeong, Seoul (KR); Won-Jun Choe, Seoul (KR)

(73) Assignees: Unidisplay, Inc., Kyeonggi-Do (KR); SNU Industry Foundation, Seoul (KR)

( * ) Notice: Subject to any disclaimer, the term of this patent is extended or adjusted under 35 U.S.C. 154(b) by 0 days.

(21) Appl. No.: 11/926,503

(22) Filed: Oct. 29, 2007

(65) Prior Publication Data

US 2008/0252504 A1    Oct. 16, 2008

(30) Foreign Application Priority Data

Apr. 12, 2007    (KR)    .................. 10-2007-0035861

(51) Int. Cl.
*H03M 1/06*    (2006.01)
(52) U.S. Cl. .................. 341/118; 341/144; 341/119; 341/120
(58) Field of Classification Search .................. 341/155, 341/154, 117, 118, 119, 120, 145, 144
See application file for complete search history.

(56) References Cited

U.S. PATENT DOCUMENTS

| | | | |
|---|---|---|---|
| 5,059,916 A | 10/1991 | Johnson | |
| 5,377,202 A | 12/1994 | Bryson et al. | |
| 5,491,432 A | 2/1996 | Wong et al. | |
| 5,731,774 A * | 3/1998 | Fujii et al. | .................. 341/144 |
| 6,642,867 B1 * | 11/2003 | Chowdhury et al. | ........ 341/118 |
| 6,822,882 B1 | 11/2004 | Jacobs et al. | |
| 7,199,745 B2 * | 4/2007 | Tachibana et al. | ........... 341/163 |
| 2008/0122671 A1 * | 5/2008 | Wang et al. | .................. 341/145 |

* cited by examiner

*Primary Examiner*—Jean B Jeanglaude
(74) *Attorney, Agent, or Firm*—Jagtiani + Guttag

(57) ABSTRACT

A technique for removing vertical stripe artifacts generated in a Liquid Crystal Display (LCD) panel, more particularly a technique for compensating for and removing an inter-channel offset voltage of a column driver, which causes the vertical stripe artifacts, is disclosed. An offset voltage generated in each channel for driving each pixel of the LCD panel is detected for a whole signal path and offset voltages detected for all channels are compared and extracted according to a given timing sequence by a common signal comparator, thereby preventing the offset of the detection comparator and reducing a chip size of the column driver in contrary to the prior art. Moreover, an inter-channel offset voltage is detected in a digital circuit mode, thereby compensating for process variations in a semiconductor chip manufacturing process in circuit terms.

4 Claims, 1 Drawing Sheet

METHOD OF COMPENSATING CHANNEL OFFSET VOLTAGE FOR COLUMN DRIVER AND COLUMN DRIVER FOR LCD IMPLEMENTED THEREOF

CROSS-REFERENCE TO RELATED PATENT APPLICATION

This application claims priority under 35 USC § 119 to a Korean Patent Application No. 10-2007-0035861, filed on Apr. 12, 2007, the contents of which are incorporated herein by reference in their entirety.

FIELD OF THE INVENTION

The present invention relates to a compensating technique for removing a channel offset voltage produced in a driving circuit for Liquid Crystal Display (LCD) panel. More specifically, the present invention relates to a technique for removing vertical stripe artifacts introduced in the LCD panel, more particularly to a compensating technique for removing an inter-channel offset voltage which causes vertical stripe artifacts in a column driver.

The unique feature of the present invention lies in that an offset voltage generated in each channel for every pixel of an LCD panel is detected with respect to the entire signal path and that the offset voltage for each channel is compared and extracted for a given timing sequence by a single comparator circuit which is shared by every channel, thereby preventing an inherent offset due to the presence of offset in offset-detection comparator circuitry and further reducing the chip size of the column driver. Moreover, the present invention makes it possible to detect an inter-channel offset voltage in a digital circuit mode. Consequently, it is possible to compensate for any process variation in the manufacture of semiconductor chips in terms of circuit compensating schemes.

BACKGROUND OF THE RELATED ART

Recent progress in digital image processing technique and flat panel display devices (FPD) makes it possible to realize high-quality images with ultra-high-resolution. A Liquid Crystal Display (LCD) panel is composed of vertical and horizontal array of pixels. Each pixel is selected by a row driver and the light transmission, therefore the brightness, for the selected pixel is determined by the voltage level which is controlled by a column driver.

The column driver drives a multiple number of pixels, for instance, sixteen (16) pixels in the exemplary case shown in FIG. 1, which inevitably produces an offset voltage among the output channels. The inter-channel offset voltage causes the offset in voltages which are applied to data lines of each pixel, which results in a noticeable vertical stripe artifacts and degradation of image quality. The vertical strip artifacts become more discernable particularly in a small-size screen device such as a micro display device.

A variety of technical solutions have been proposed in an effort to resolve the inter-channel offset voltage problem. For example, the prior art discloses a technique where the size of a transistor at the input is increased for the compensation of the inter-channel offset voltage. Much effort has been made in the tight control of the semiconductor chip manufacturing process in order to prevent the generation of the offset.

However, the prior art of controlling the size of the input transistor has a technical limit because the chip size and therefore the manufacturing cost also increases with the size of the transistor. Furthermore, it is inevitable to have some variations and fluctuations in the production line despite of the tight control of a semiconductor chip manufacturing process. Moreover, the offset which is produced during the digital-analog converting process is also unavoidable as well as in the amplifiers. More recently, an approach was proposed wherein an offset voltage for each channel is detected via Analog-to-Digital Converters (ADC) for controlling the bias value of an amplifier (AMP) and the offset is subtracted from input digital data in order to compensate for the detected offset voltage.

This method, however, also has a shortcoming in that the ADC itself connected to each channel possibly has its own offset characteristics and therefore additional offsets can be generated due to the inherent offsets present in the ADC which was used for the compensating purpose of channel offset. In other words, the prior art has a technical limit because of the inherent presence of the offsets among the ADCs which are connected to the channels, which has to be removed in the design of the offset-removing ADCs.

SUMMARY OF THE INVENTION

A goal of the present invention is to provide a method of compensating an inter-channel offset in a column driver for Liquid Crystal Display (LCD) panel and the column driver implemented thereof.

Another goal of the present invention is to provide a channel offset compensation scheme which makes it possible to compensate for the inter-channel offset voltage even if the process parameters vary due to the fluctuation in a semiconductor chip manufacturing process.

To accomplish the goals of the present invention, a novel n-channel column driver for a Liquid Crystal Display (LCD) panel is provided. The n-channel column driver comprises a plurality (n) of Digital-to-Analog Converters (DAC) which converts digital data of n channels into analog signals, and a plurality (n) of amplifiers which receives the analog signal output from the n DACs and amplifies the analog signal for driving the data lines of pixels. The n-channel column driver comprises also comprises a switch array wherein the driving voltages for the n channels, which are output from the n amplifiers, are switched to the data lines of the n channels through switches T0, T1, T2, . . . , T15 during a normal operation mode while the driving voltages for the n channels are switched to an input terminal of a comparator through selecting switches S0, S1, S2, . . . , Sn in accordance with a timing clock sequence of a controller during a test mode. The n-channel column driver further comprises a comparator which compares the voltages from the switches S0, S1, S2, . . . , Sn with respect to a reference voltage level and produces high or low digital data in accordance with the timing clock sequence of the controller during test mode for offset voltage detection. The n-channel column driver further comprises a memory which receives a digital signal train from the comparator during the test mode for offset voltage detection under the control of the controller and stores the offset voltage data for each n channel and provides the offset voltage data to a subtracting unit under the control of the controller during the normal operation mode. The n-channel column driver further comprises a subtracting unit which reads out the offset voltage data for each n channels stored in the memory, subtracts the read-out offset voltage data from a digital input signal during the normal operation mode, and inputs the subtraction result to the n DACs. The n-channel column driver further comprises a controller which scans the voltage level of the reference of the comparator during the test mode and generates the timing clock sequence for selecting outputs of the n amplifiers and connecting the outputs to the comparator, stores the offset voltage data for each of the n channels in the memory, and controls the access to the stored offset voltage data.

The present invention has a feature of utilizing a single comparator for extracting an offset for the entire signal path for a particular channel including a Digital-to-Analog Converter (DAC) and the detected offset for each channel is stored in a memory. The input data train is then compensated by the operation of subtraction of the input data by the corresponding offset which is accessed from the memory when inputting the input data to the DAC.

Consequently, the offsets generated in each entire path from the data input to the data output can be taken into account and any generation of additional offsets among a plurality of comparators can be avoided by utilizing only a single unit of comparator in contrary to the prior art. Furthermore, the chip size can also be reduced since we use only a single comparator in contrary to the prior art.

We also propose a compensating method of an offset voltage for an n-channel column driver comprising n Digital-to-Analog Converters (DAC) and n amplifiers. The offset voltage is extracted by operating the column driver in a test mode prior to a normal operation mode. The extracted offset voltage is utilized for the subtraction from the input data and the compensated input voltage is applied to the inputs of the DACs in the normal operation mode, thereby compensating for the offset voltage. The method comprises (a) a step of inputting zero (0) as a digital input of the DAC for a particular channel, selecting an output of the amplifier, comparing a reference voltage of the comparator with the selected output, and outputting a digital signal either of 1 or 0, (b) a step of repeating step (a) by changing the reference voltage of the comparator to a next level, (c) a step of repeating steps (a) and (b) by swapping input terminals of the comparator in order to obtain an average value, (d) a step of storing data output from the comparator in (a), (b), and (c) in a memory, and (e) a step of subtracting data stored in the memory from input data and inputting the subtraction result to the DAC.

DETAILED DESCRIPTION OF THE INVENTION

Figure 1:
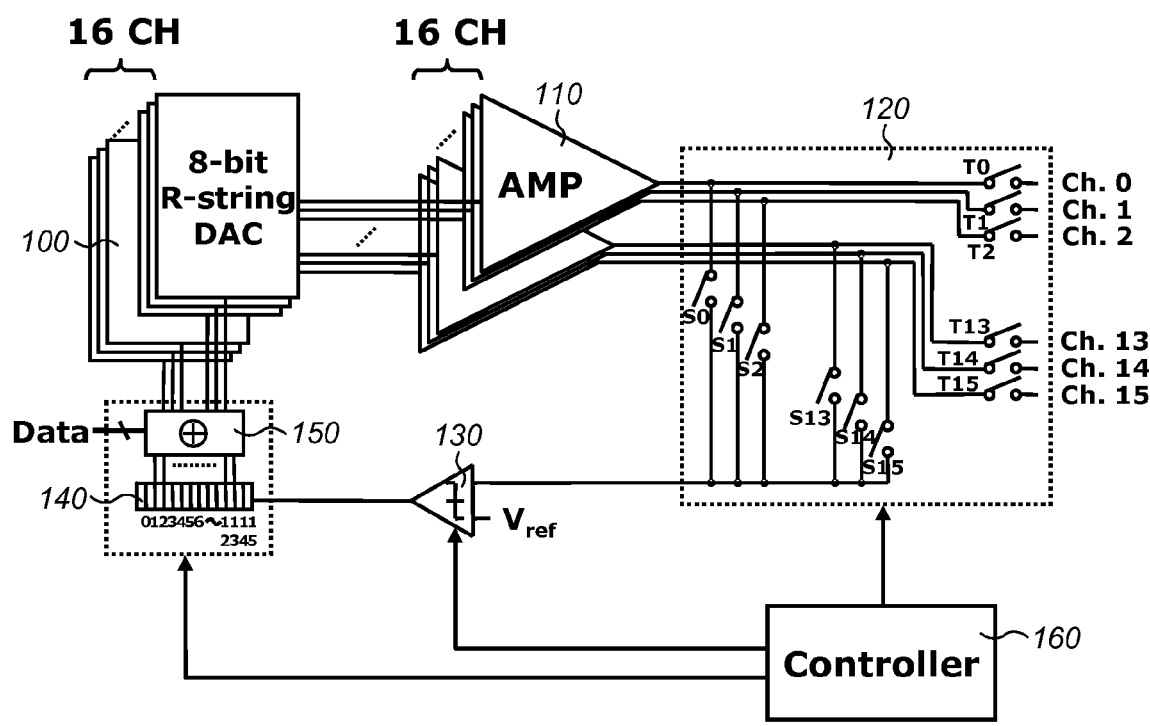
FIG. 1 is a schematic which illustrates the structure of a column driver in which an inter-channel offset is compensated by a single comparator in accordance with a preferred embodiment of the present invention.

Hereinafter, a method of compensating for an inter-channel offset voltage according to the present invention will be described with reference to FIG. 1.

FIG. 1 illustrates the structure of a column driver in which an inter-channel offset is compensated in accordance with the present invention. Analog output voltage from each Digital-to-Analog Converter (DAC) 100 is applied to the data line for an LC pixel through amplifiers (or output drivers) 110. According to a preferred embodiment of the present invention, a unity gain amplifier can be used for the amplifier 110.

Referring to FIG. 1, an output voltage from each amplifier 110 is delivered to a switch array 120 for each corresponding output channel. Although 16 channels are chosen as the output channels in FIG. 1, the number of channels can be altered and 16 is chosen just for the explanation of the subject matter of the present invention. The number of output channels is not necessarily limited thereto.

Referring to FIG. 1, the DAC 100 converts a digital signal into an analog signal and converts a positive voltage level as well as a negative voltage level which is represented by 8 bits into an analog signal. Herein, a positive and negative voltage is alternatively applied for driving liquid crystal pixels. The physics behind for the alternative switching of the polarity of the applied voltage is well known to those with ordinary skill in the art and thus the detailed description thereof will not be provided here.

In accordance with a preferred embodiment of the present invention, sixteen (16) digital-to-analog converters (DAC) 100 produces analog for the application to the channels. The column driver according to the present invention can be operated in two types of modes, i.e., normal operation mode and test mode for the extraction of offset voltages wherein the mode selection is controlled by a controller 160.

The column driver of the present invention initiates test mode when it is turned on with power. In this initiation stage, i.e. test mode, switch points T0, T1, T2, . . . , T15 of the switch array 120 are set open-circuited and thus do not transfer any output signals to data lines of pixels while switch points S0, S1, S2, . . . , S15 of the switch array 120 deliver the detected voltages to the non-inverting input of a comparator 130 in a successive manner for each channel in accordance with a pre-defined sequence under the control of the controller 160.

During the test mode, the offset voltage for each channel is sequentially sampled and fed to the input of the comparator 130 since the switch points S0, S1, S2, . . . , S15 are switched on to the input of the comparator one by one under the control of the controller 160. According to a preferred embodiment of the present invention, 16 offsets in a positive (+) direction for the 16 channels as well as 16 offsets in a negative (−) direction for the 16 channels, i.e., a total of 32 offset data can be extracted with respect to a single reference voltage of the comparator 130, according to a given timing clock signal, which is repeated with varying the reference voltage of the comparator 130. To compensate for the offset of the comparator 130 during the detection, the extraction process can be repeated while swapping a non-inverting terminal with an inverting terminal. The test mode is controlled by the controller 160 according to the present invention and may be controlled in such a way that 32 offset data can be sequentially extracted according to a given timing clock.

The comparator 130 illustrated in FIG. 1 compares the magnitude of a signal sequentially input from the switch array S0, S1, S2, . . . , S15 with a reference voltage $V_{ref}$ and outputs either high or low digital signal according to the comparison process.

A digital signal train comprising either 1 or 0 from the comparator 130 for each channel is then stored in a memory 140 as an offset voltage value for a particular channel. When the column driver operates in the normal operation mode, stored offset data is accessed from the memory and fed to subtracting unit 150 for differentiating the input signal train for compensation under the control of the controller 160 and thus the offset-compensated input signal is input to the DAC 100.

According to the present invention, the switches S0, S1, S2, . . . , S15 are switched on one by one under the control of the controller 160 in order to extract an offset voltage generated in each channel. Digital data output from the comparator 130 from the comparison of the detected offset voltage with a reference voltage is serially input and stored in the memory 140. Offset voltage data is accessed when input signal train is received and the input data is adjusted by compensation with accessed offset data. In other words, the subtraction result by the offset is input to the DAC 100, thereby compensating for the offset.

The essential feature of the present invention is to extract an overall actual offset voltage in which all offsets present in the entire signal paths of channels as well as an offset generated in the amplifier 110 are reflected. Moreover, by detecting offsets for the 16 channels using the comparator 130, an offset generated in the comparator 130 can also be canceled.

In the method of compensating for an inter-channel offset voltage according to the present invention, when the controller 160 controls the column driver to enter the test mode for inter-channel offset voltage detection after the column driver is initially provided with power to start operating, offset voltage detection for all channels are sequentially performed according to a predetermined timing clock sequence as mentioned above. Upon completion of the test mode, the controller 160 switches the column driver to the normal operation mode according to a flag. Offset data stored in the memory 140 is accessed and subtracted from input digital data, and the subtraction result is input to the DAC 100.

In other words, once power supply to a liquid crystal driving chip starts, the column driver starts operating in the test mode and thus the switches T0, T1, T2, . . . , T15 at a channel output side are all open and the switches S0, S1, S2, . . . , S15 are sequentially connected according to an offset voltage detection sequence.

According to a preferred embodiment of the present invention, the reference voltage of the comparator 130 may have 32 levels and 32 offset voltage detection processes are required for each channel in the test mode for comparison with the reference voltage of 32 levels.

Since a positive voltage and a negative voltage are applied by turns due to a liquid crystal driving way, a total of 64 comparison processes may be performed for each channel in consideration of 32 levels of the positive voltage and 32 levels of the negative voltage.

According to a preferred embodiment of the present invention, by swapping the non-inverting terminal and the inverting terminal to compensate for the offset of the comparator 130, the offset can be averaged and compensated for. Therefore, according to the present invention, for each channel, the reference voltage of the comparator 130, e.g., 32 levels, is scanned for comparison, is scanned for the positive voltage and the negative voltage, and is scanned for the swapped terminal of the comparator 130, thereby accurately measuring and detecting an offset voltage for each channel.

As is apparent from the foregoing description, an offset voltage generated in each channel for driving each pixel of an LCD panel is detected for a whole signal path and offset voltages for all channels are compared and extracted by a single comparator according to a timing sequence, thereby reducing the size of the column driver and removing the additional offset of the comparator. Furthermore, since the offset voltage is detected in a digital circuit mode, it can be compensated for in circuit terms in spite of variation and fluctuation in a semiconductor chip manufacturing process.

The foregoing has outlined rather broadly the features and technical advantages of the present invention in order that the following claims of the invention may be better understood. Additional features and advantages of the invention will be described hereinafter which form the claims of the invention. It should be appreciated by those skilled in the art that the conception and specific embodiment disclosed may be readily utilized as a basis for modifying or designing other structures or processes for carrying out the similar purposes of the present invention.

In addition, the conception and specific embodiment disclosed may be utilized by those skilled in the art as a basis for modifying or designing other structures or processes for carrying out the same purposes of the present invention. It should also be realized by those skilled in the art that such equivalent constructions do not depart from the spirit and scope of the invention as set forth in the appended claims.

What is claimed is:

1. A column driver for Liquid Crystal Display (LCD) panel, which drives data lines for pixels of the panel, the column driver comprising:

n number of Digital-to-Analog Converters (DAC) which receives digital data for n channels, and converts the digital data into analog signals for n channels;

n number of amplifiers which receives the analog signals from the output of the n DAC and amplifies the analog signals for driving the data lines of the pixels;

a switch array for switching the output of the n amplifiers either to n data lines or to the an input of the comparator wherein said switch array delivers the output voltages of the amplifiers for each of n channels to each data line of the pixel through switch points T0, T1, T2, . . . , T15 during the normal operation mode while said switch array delivers the output voltages of the amplifiers for each of n channels to an input terminal of a comparator through selecting switch points S0, S1, S2, . . . , Sn in a successive manner according to a timing clock sequence controlled by a controller during the test mode;

the comparator which compares the output voltage of the amplifier via the switch points S0, S1, S2, . . . , Sn with a reference voltage level and outputs a train of either high or low digital level in accordance with the timing clock sequence controlled by the controller during the test mode for the extraction of offset voltage data;

a memory which receives a digital signal train from the comparator during the test mode for extracting the offset voltage under the control of the controller, stores the offset voltage data for each of n channels, and provides a subtracting unit with the offset voltage data under the control of the controller during the normal operation mode;

the subtracting unit which reads out the offset voltage data for each of n channels stored in the memory, subtracts the read-out offset voltage data from a digital input signal input during the normal operation mode, and feeds the subtraction result to the n DACs; and the controller which scans a reference voltage for the comparator as a plurality of levels for application during the test mode, generates the timing clock sequence for selecting outputs of the n amplifiers, connects the outputs to the comparator, stores the offset voltage data for each of the n channels in the memory, and controls the access to the stored offset voltage data.

2. The column driver of claim 1, wherein the controller generates a clock for selecting one of the outputs out of n amplifiers, scans the reference voltage level which is applied to the comparator as a plurality of levels for input, and swaps the reference voltage input to the comparator and the outputs of the n amplifiers for input.

3. The column driver of claim 1, wherein the n amplifiers include an amplifier having an amplification factor of unity.

4. A method of compensating for an offset voltage for an n-channel column driver, in which an inter-channel offset voltage of the column driver of a Liquid Crystal Display (LCD) panel composed of n Digital-to-Analog Converters (DAC) and n amplifiers is detected by operating the column driver in a test mode prior to a normal operation mode, the detected offset voltage is subtracted from input data to be applied to inputs of the DACs in the normal operation mode, thereby compensating for the offset voltage, the method comprising the steps of:

(a) inputting 0 as a digital input of the DAC for a particular channel, selecting an output of the amplifier, comparing a reference voltage of the comparator with the selected output, and outputting a digital signal of 1 or 0;

(b) repeating (a) by changing the reference voltage of the comparator to a next level;

(c) repeating (a) and (b) by swapping input terminals of the comparator in order to obtain an average value;

(d) storing data output from the comparator in (a), (b), and (c) in a memory; and (e) subtracting data stored in the memory from input data and inputting the subtraction result to the DAC.

* * * * *